United States Patent
Rehm

(10) Patent No.: US 7,170,804 B2
(45) Date of Patent: Jan. 30, 2007

(54) TEST MODE FOR DETECTING A FLOATING WORD LINE

(75) Inventor: Norbert Rehm, Apex, NC (US)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 11/098,998

(22) Filed: Apr. 5, 2005

(65) Prior Publication Data

US 2006/0221690 A1    Oct. 5, 2006

(51) Int. Cl.
   *G11C 29/00* (2006.01)
(52) U.S. Cl. .................... 365/201; 365/230.03
(58) Field of Classification Search ............... 365/201, 365/230.03, 230.06
   See application file for complete search history.

(56) References Cited

U.S. PATENT DOCUMENTS 5,856,942 A * 1/1999 Lee et al. .............. 365/185.11
6,426,914 B1 * 7/2002 Dennard et al. ....... 365/230.06

* cited by examiner

*Primary Examiner*—Vu A. Le
(74) *Attorney, Agent, or Firm*—Patterson & Sheridan, L.L.P.

(57) ABSTRACT

Devices and methods that allow floating word lines in memory arrays to be detected are provided. By driving local word lines from each side with divided drive lines, local word lines on one side of the memory array may be set to an predetermined voltage level (e.g., an intermediate voltage level between $V_{PP}$ and $V_{NWLL}$). After disconnecting the local word lines on the one side, memory cells on the other side may be tested for read failures, which may indicate floating word lines on the one side.

22 Claims, 8 Drawing Sheets

TEST MODE FOR DETECTING A FLOATING WORD LINE

BACKGROUND OF THE INVENTION

1. Field of the Invention

The invention generally relates to testing memory devices and, more particularly, to devices and techniques that allow the detection of floating word lines in dynamic random access memory (DRAM) devices.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

Such devices utilize memory cells (also referred to as storage nodes) typically consisting of one transistor and one capacitor. The cells are accessed by activating a word line, switching on the transistor and coupling the capacitor to a bit line. The stored charge on the capacitor is then sensed by a sense amplifier to determine if a logical '1' or '0' is stored in the accessed cell. To optimize access to cells (e.g., to speed access, simplify signal routing, and/or facilitate layout), word lines are sometimes grouped and controlled by master word lines. Individual word lines in a group (referred to as local word lines to distinguish them from master word lines) are activated by a) activating the controlling master word line for the group and b) asserting a drive line for a particular word line.

FIG. 1 shows a portion of a conventional array structure 100, utilizing groups of word lines 102 controlled by master word lines 110, to access memory cells 107, in a standby mode. Illustratively, each master word line 110 controls four (4) local word lines 102. In the illustrated standby mode, word line (WL) reset lines 124 are activated (as indicated by bold lines), thereby pulling each connected word line 102 down to a low (or negative) word line voltage level ($V_{NWLL}$) via pull down transistors 114. This keeps the cell transistors connected to the word lines 102 closed, thereby maintaining the information as stored charge in the cell capacitors.

FIG. 2 shows the same array portion as FIG. 1, but this time in an active mode with the left most master word line group (group 0) selected, as indicated by the bold border for the corresponding master word line 110. Illustratively, the word line 0 drive line 122 (WL Drive 0) is pulled up (as indicated by the bold line) to a word line high voltage ($V_{PP}$) and in each word line group, the corresponding pull up transistor 112 is connected to $V_{PP}$.

Only in the selected master word line group (group 0 in this example) the pull up transistor 112 is activated, thereby connecting the corresponding local word line 102 to $V_{PP}$, via the drive line 122 (as indicated by the bold line). This causes the cell transistor of the corresponding memory cell 107 to be switched on, thereby connecting the cell transistor to the bit line 103. As a result, information can be read from or written to the memory cell 107 via the bit line (BL) 103, by a sense amplifier 104. In a similar manner, information can be read from or written to the other memory cells 107 via the same bit line, as well as complementary bit line (/BL) 103 by activating other master word lines 110 and drive lines 122.

In the illustrated example, the local word lines 102 are driven only from one side. Unfortunately, this single sided concept has the disadvantage that as soon as the drive voltage is removed from this drive side, the local word lines are not driven any more and may float at an undefined level.

Simulations have shown that the critical voltage range for a "floating word line" is currently in the range of 1.3V to 1.6V. In this range, it has been observed that memory cells connected to floating word lines can destroy information stored in good word line connected cells (e.g., by remaining connected to bit lines), leading to read failures. Analysis has shown that typically only word lines which remain pulled up somewhat, for example, due to lack of a pull down connection due to a defect (region 130 shown in FIG. 2), generate application relevant problems. Actual floating word lines which are not connected to anything seem not to cause these problems. Unfortunately, in current designs utilizing drive lines driven from one side, it is difficult to drive a word line to a defined intermediate $V_{PP}$ level and test for this floating word line condition fast enough (e.g., before this level is lost).

Therefore, there has not been a reliable method to identify chips which are affected by this floating word line problem, e.g., at wafer test. Accordingly, what is needed are apparatus and methods that allow testing to identify chips having floating word lines that cause read failures.

SUMMARY OF THE INVENTION

Embodiments of the invention generally provide apparatus and methods that allows testing to identify chips having floating word lines.

One embodiment provides a method for detecting floating word lines in a dynamic random access memory device having at least one memory array, wherein voltage levels are applied to word lines of different side segments of the array by different drive and reset lines. The method generally includes forcing one or more first word lines in a first side segment of the memory array to an intermediate voltage level between a word line high voltage level and a negative word line low voltage level, applying the negative word line voltage level to one or more reset lines of the first side segment coupled to the first word lines via one or more pull-down transistors, and accessing one or more memory cells on a second side segment of the memory array to detect a read failure indicative of one of the first word lines not being properly connected to the reset line via one of the pull-down transistors.

Another embodiment provides a method of testing a memory device with a memory array having at least first and second side segments, wherein word lines in the first side segment are driven by different drive and reset lines than the word lines in the second side segment. The method generally includes driving word lines in both the first and second side segments in a substantially similar manner, via the different drive and reset lines, when the memory device is in a first mode, and driving word lines in the first and second side segments in an independent manner, via the different drive and reset lines, when the memory device is in a second mode.

Another embodiment provides a memory array. The memory array generally includes first and second sets of one or more master word lines on corresponding first and second side segments of the array, for each master word line, a plurality of local word lines, each coupled with at least one memory cell, one or more common bit lines coupled to memory cells on both the first and second side segments, and divided drive and reset lines allowing local word lines on the first side segment to be driven to different voltage level than corresponding local word lines on the second side segment.

Another embodiment provides a memory device generally including at least one memory array and control circuitry. The memory array generally includes first and second side segments, each segment comprising a plurality of word lines, one or more common bit lines coupled to memory cells accessible via word lines in both the first and second side segments, and at least first and second pairs of drive and reset lines allowing word lines in the first and second side segments to be driven to different voltage levels. The control circuitry is generally configured to force a first one or more word lines in the first side segment to an intermediate voltage level between a word line high voltage level and a negative word line low voltage level, via a corresponding one or more drive lines, apply the negative word line voltage level to one or more corresponding reset lines of the first side segment coupled to the first word lines via one or more pull-down transistors, and access one or more memory cells on a second side segment of the memory array to detect a read failure indicative of one of the first word lines not being properly connected to the reset line via one of the pull-down transistors.

Another embodiment provides a test system generally including a memory device under test and a tester. The memory device generally includes at least one memory array with first and second side segments, each segment comprising a plurality of word lines, one or more common bit lines coupled to memory cells accessible via word lines in both the first and second side segments, and at least first and second pairs of drive and reset lines allowing word lines in the first and second side segments to be driven to different voltage levels independently. The tester is generally programmed to test the device by placing the memory device in a test mode wherein the memory device is configured to force one or more first word lines in the first side segment of the memory array to an intermediate voltage level between a word line high voltage level and a negative word line low voltage level, apply the negative word line voltage level to one or more reset lines of the first side segment coupled to the first word lines via one or more pull-down transistors, and access one or more memory cells on a second side segment of the memory array

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide devices and methods that allow floating word lines in memory arrays to be detected. By driving local word lines from each side with divided drive lines, local word lines on one side of the memory array may be set to a predetermined voltage level (e.g., an intermediate voltage level between $V_{PP}$ and $V_{NWLL}$). After disconnecting the local word lines on the one side, memory cells on the other side may be tested for read failures, which may indicate floating word lines on the one side.

As described herein, word lines may be driven (independently) from both sides of an array by providing divided local word line drive and reset lines. As used herein, the term drive line generally refers to a conductive line to which a drive signal is applied to connect local word lines to $V_{PP}$ via pull-up transistors of a master word line, while the term reset lines generally refers to a conductive line used to connect local word lines to $V_{NWLL}$ via pull-down transistors of a master word line.

For illustrative purposes, arrays described herein have the following characteristics: while word line drive and reset lines are divided, bitline (BL) lengths are not divided. Maintaining the bit line length, cells connected to floating word lines in one side of the array may share a common bit line with cells on the other side of the array. Dividing the drive and reset lines allow word lines in both sides of an array to be driven independently during a test mode (used to detect read failures induced by floating word lines). However, when this test mode is inactive, both sides are typically driven at the same time, as in conventional arrays. While the drive and reset lines are illustratively shown as being physically divided, for some embodiments, the drive and reset lines may be selectably dividable, for example, via some type of switch arrangement.

A Memory Array with Divided Local Word Line Drive Lines

Figure 1:
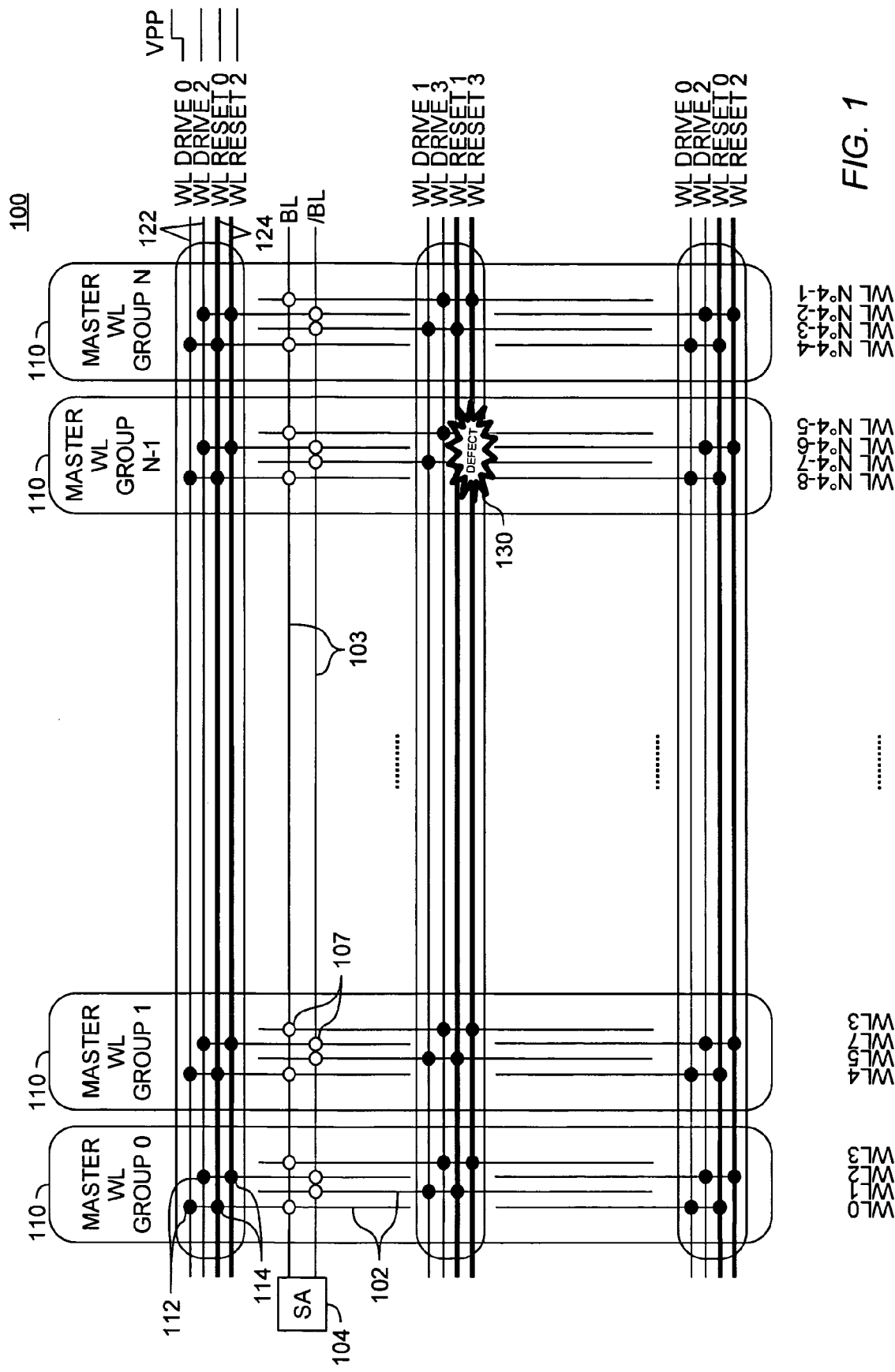
FIG. 1 illustrates an exemplary conventional memory array segment in a standby mode.
Figure 2:
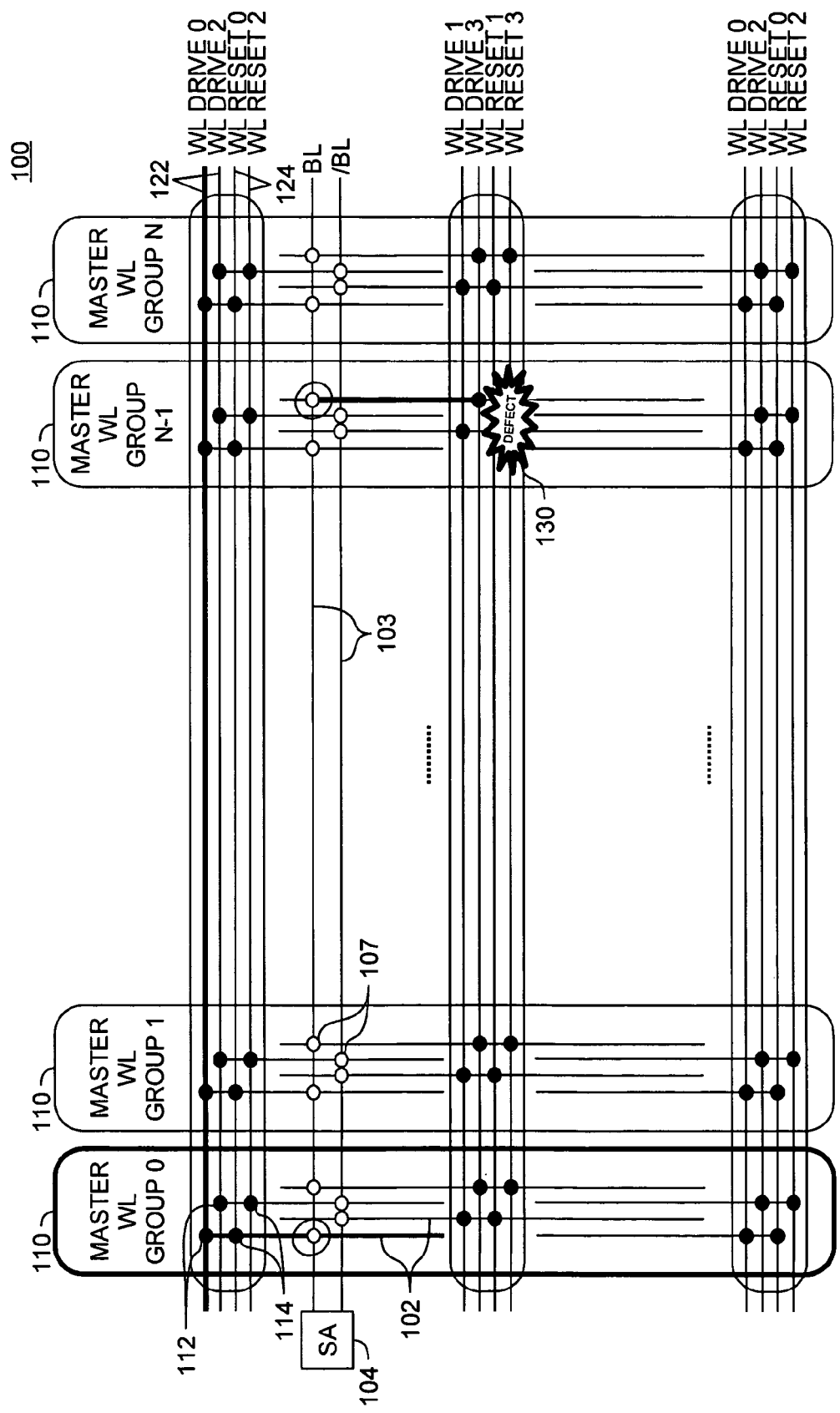
FIG. 2 illustrates an exemplary conventional memory array segment in an active mode.
Figure 3A:
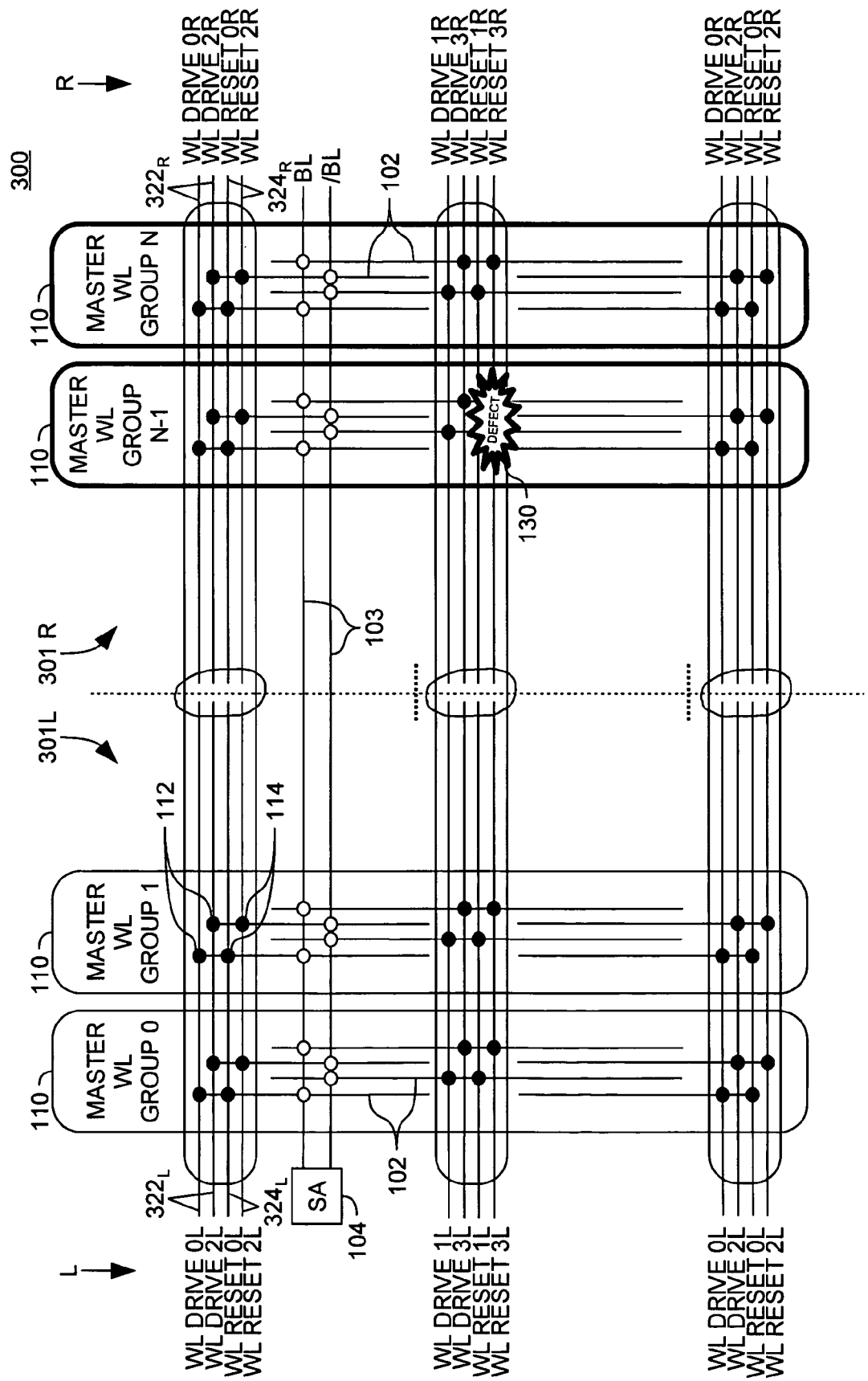
FIGS. 3A and 3B illustrate an exemplary memory array segment in a standby state of a test mode and corresponding signal timing diagram, in accordance with one embodiment of the present invention.

FIG. 3A illustrates an exemplary memory array segment 300 in an activated test mode, in accordance with one embodiment of the present invention. As illustrated, the array 300 may be divided into a left side segment $301_L$ and right side segment $301_R$ (those skilled in the art will recognize that this left and right orientation is arbitrary), with pairs of bit lines 103 common to both portions. Local word lines 102 on the left side segment $301_L$ are driven (pulled up) and reset (pulled down) via drive and reset lines $322_L$ and $324_L$, while local word lines 102 on the right side segment $301_R$ are driven and reset via drive and reset lines $322_R$ and $324_R$.

Because the reset and drive lines are divided, word lines 102 in the left and right segments may be driven independently, which enables testing for floating word lines. As previously described, if the test mode is not activated, word lines in both the right and left side segments may be driven conventionally (e.g. with the drive and reset lines driven the same way as on the right side). However, when the test mode is activated word lines 102 in the right and left side segments may be driven independently (in the illustrated example, the test mode is configured to test for floating word lines 102 in the right side segment $301_R$).

Figure 3B:
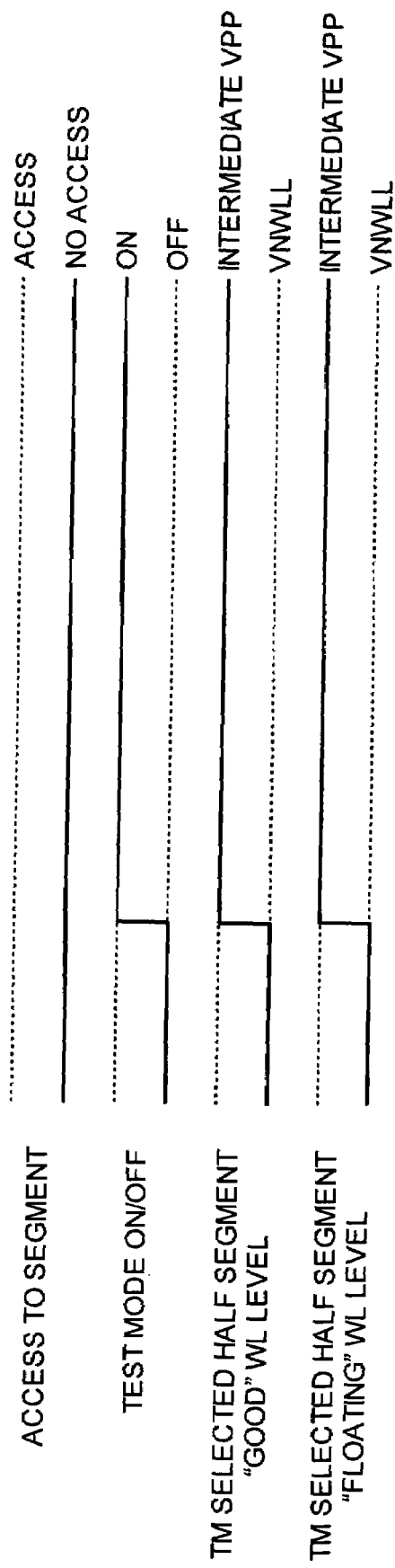

For example, as shown in the corresponding timing diagram of FIG. 3B, in a standby state of the test mode, the word lines 102 in the right side segment $301_R$ may be driven (or "forced") to an intermediate voltage level between $V_{PP}$ and $V_{NWLL}$ (labeled "Intermediate $V_{PP}$"), while word lines in the left side segment $301_L$ remain deactivated (pulled down). This intermediate voltage level may be applied to the drive lines $322_R$ connected to the local word lines 102 via pull-up transistors 112 when the master word lines are activated. This intermediate voltage level may be supplied externally or generated internally (e.g., via a trimmable internal voltage generator) and the particular level may be chosen to place the word lines in a voltage range (e.g., 1.3–1.6V) that has been shown to be problematic.

Floating word lines 102 in one side of the array (e.g., the right side segment $301_R$) that remain connected to the pull up but not connected to the pull down, due to some defect 130, may cause read failures in cells on the other side of the array (e.g., the left side segment $301_L$). Such a defect can appear in different layers but typically has in common that the pull down is disconnected in some manner (e.g., due to a defective connection to the pull down transistor or due to defective operation of the transistor itself). As a result, even when the intermediate voltage level is not driven anymore and $V_{NWLL}$ is applied to the reset drive lines 324, these floating word lines are not pulled down (via pull-down transistors 114) and remain at the intermediate voltage level for some time.

Figure 4A:
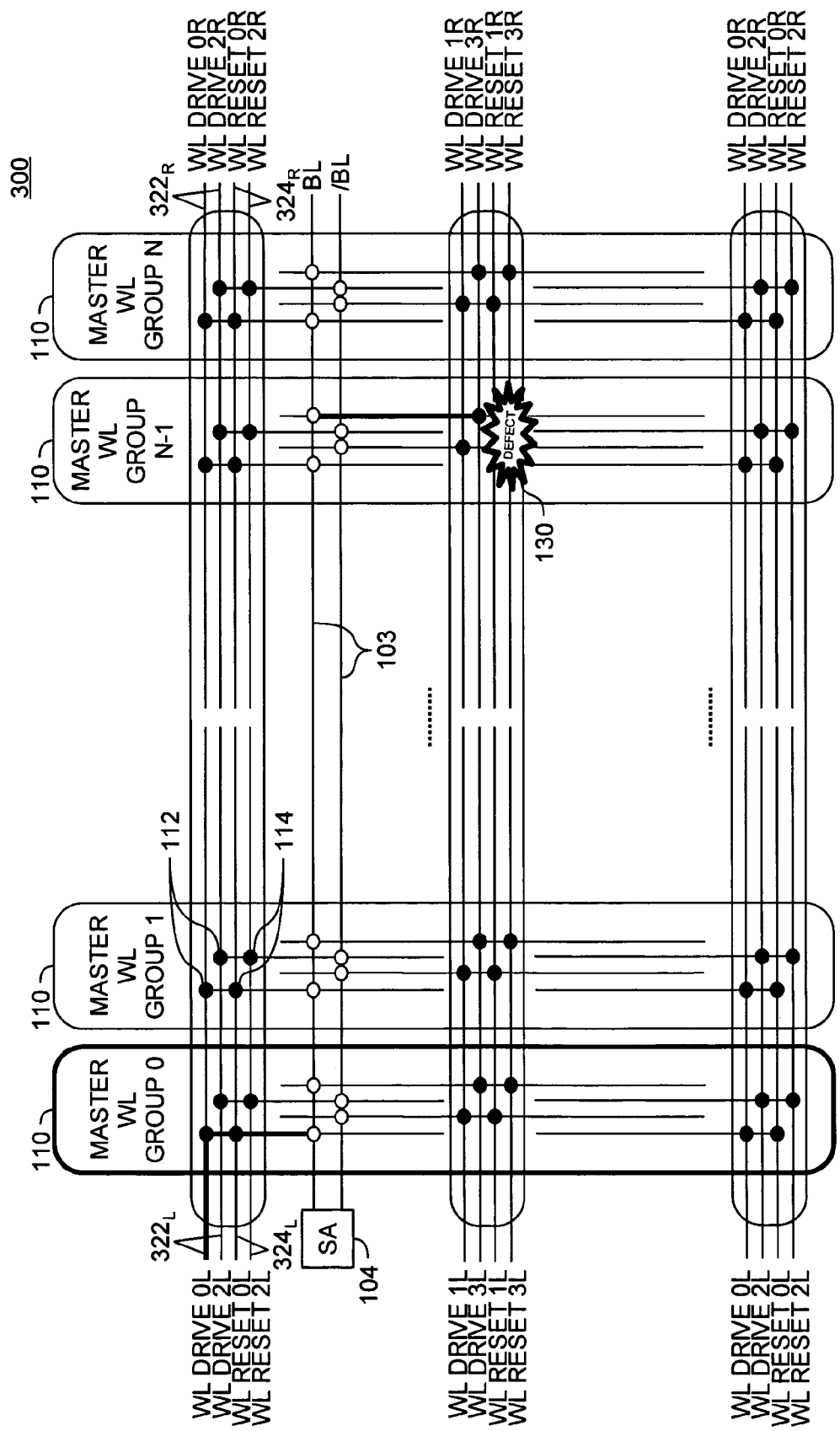
FIGS. 4A and 4B illustrate an exemplary memory array segment in an active state of a test mode and corresponding signal timing diagram, in accordance with one embodiment of the present invention.
Figure 4B:
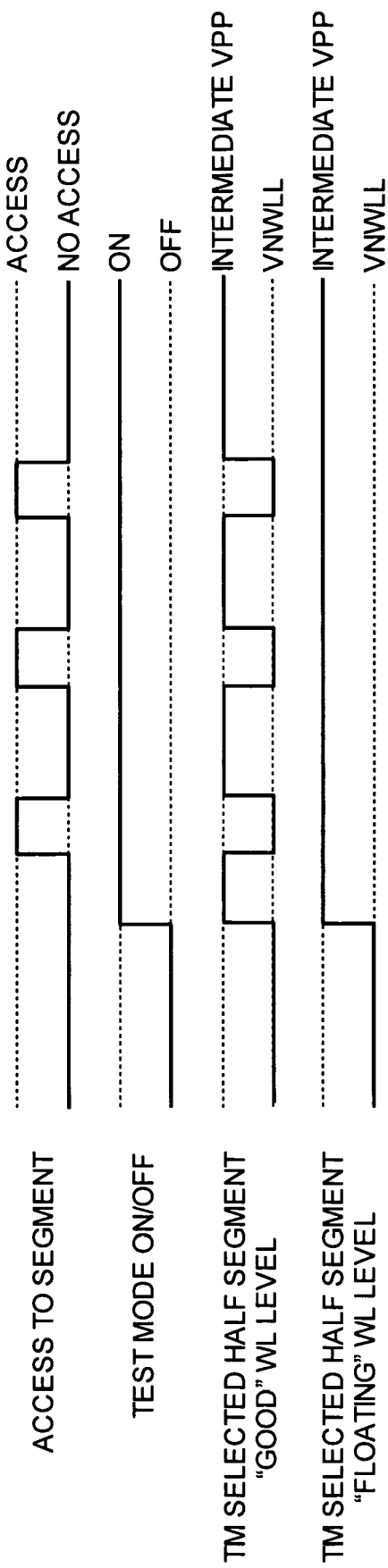

This is illustrated in the timing diagram of FIG. 4B, which shows how a "good" word line gets pulled down to $V_{NWLL}$, while a floating word line remains at the intermediate voltage level. As a result, the corresponding memory cell 107 accessed with the floating word line may remain connected to a bit line 103 which may adversely effect the information written to or read from another cell 107 connected to the same bitline 103. As illustrated in FIG. 4A, local word line segments shown below the defect may not cause application failures, as they do not remain connected to the pull-up. On the other hand, the word line segments shown above the defect 130 may remain connected to the pull-up when the intermediate voltage level is applied and may, therefore, lead to application failures.

In any case, by being able to force these word lines on one side of the array to the intermediate voltage range, test data patterns may be devised to detect these read failures by accessing cells on the other side of the array. For example, these test data patterns may be selected such that a bit of data written to a memory cell that remains connected to a bit line due to a floating word line (in one side segment of the array) would adversely affect access to a bit of data in a memory cell in the other side segment of the array. Detecting these read failures may allow devices with defects causing floating word lines to be identified at the front end (e.g., during wafer test).

FIG. 4A shows an embodiment of the proposed word line segment in an active state of the test mode, where word line 0 of master group 0 (in the left side segment $301_L$) is accessed in order to detect floating word lines in the right side segment $301_R$. This word line may be accessed quickly enough after releasing the word lines on the right side segment $301_R$ from the intermediate voltage, such that floating word lines (that are not connected to the pull down) are not pull down naturally (e.g., by leakage). In other words, the intermediate $V_{PP}$ level may be removed from the word lines on the right side segment $301_R$ just before accessing the word line in the left side segment $301_L$, causing properly connected word lines to be pulled down to $V_{NWLL}$. Floating word lines, on the other hand, will remain at the intermediate voltage level, which may cause memory cells 107 connected thereto to remain coupled to the bit lines, which may adversely affect access to memory cells 107 in the left side of the array 300.

Exemplary Test Operations

Figure 5:
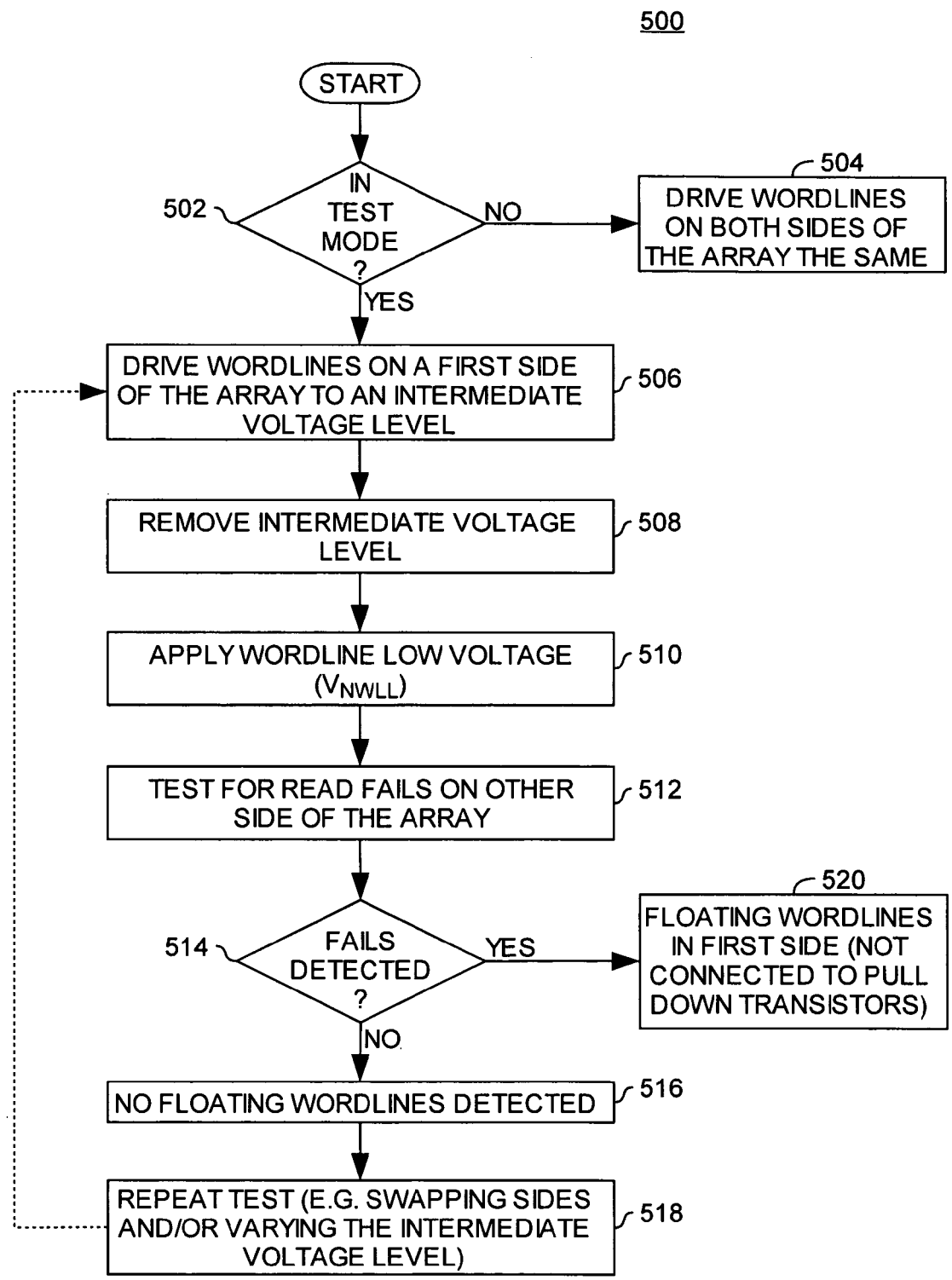
FIG. 5 illustrates a flow diagram of exemplary operations for detecting floating word lines in the memory array segment shown in FIGS. 3 and 4.

FIG. 5 illustrates a flow diagram of exemplary operations 500 for detecting floating word lines in a memory device having memory array segments as shown in FIGS. 3 and 4, according to one embodiment of the invention. As illustrated, if the device is not in the test mode (for detecting floating word lines), as determined at step 502, word lines on both sides of the array may be driven, at step 504.

On the other hand, if the device is in test mode, word lines on different sides of the array may be driven independently, as shown in steps 506–520. At step 506, word lines on one side of the array are driven to an intermediate voltage level, as shown in FIG. 3A. Depending on a particular embodiment, any number of different word lines may be precharged to the intermediate voltage level. For example, only one or multiple (up to n/2 assuming n total master word lines) master word lines may be activated.

In any case, at step 508, the intermediate voltage level is removed and, at step 510, word line low voltage ($V_{NWLL}$) is applied to the word lines via the reset lines. As a result, properly connected word lines should be pulled down to $V_{NWLL}$. However, word lines that are not properly connected to pull downs may remain at the intermediate voltage level.

To detect these floating word lines, a test for read failures on the other side of the array is performed at step 512. For example, a data pattern as described above may have been previously written to cells on both sides of the array sharing a common bit line. If a read failure is detected (e.g., based on a mismatch between the information read and that written), at step 514, a floating word line in the first side may be assumed, at step 520 and the device may be identified as containing a defect which in some cases may be repairable (e.g., via redundancy).

If a read failure is not detected, no floating word lines are assumed, at step 516, and the test may be repeated, at step 518. Depending on the particular embodiment, the test may be repeated with varying parameters, for example, by varying values for the intermediate voltage level, by selecting different word lines or groups of word lines on the same or different side of the array, and the like. In some cases, many of these parameters may be controlled via one or more control registers.

An Exemplary Test System

Figure 6:
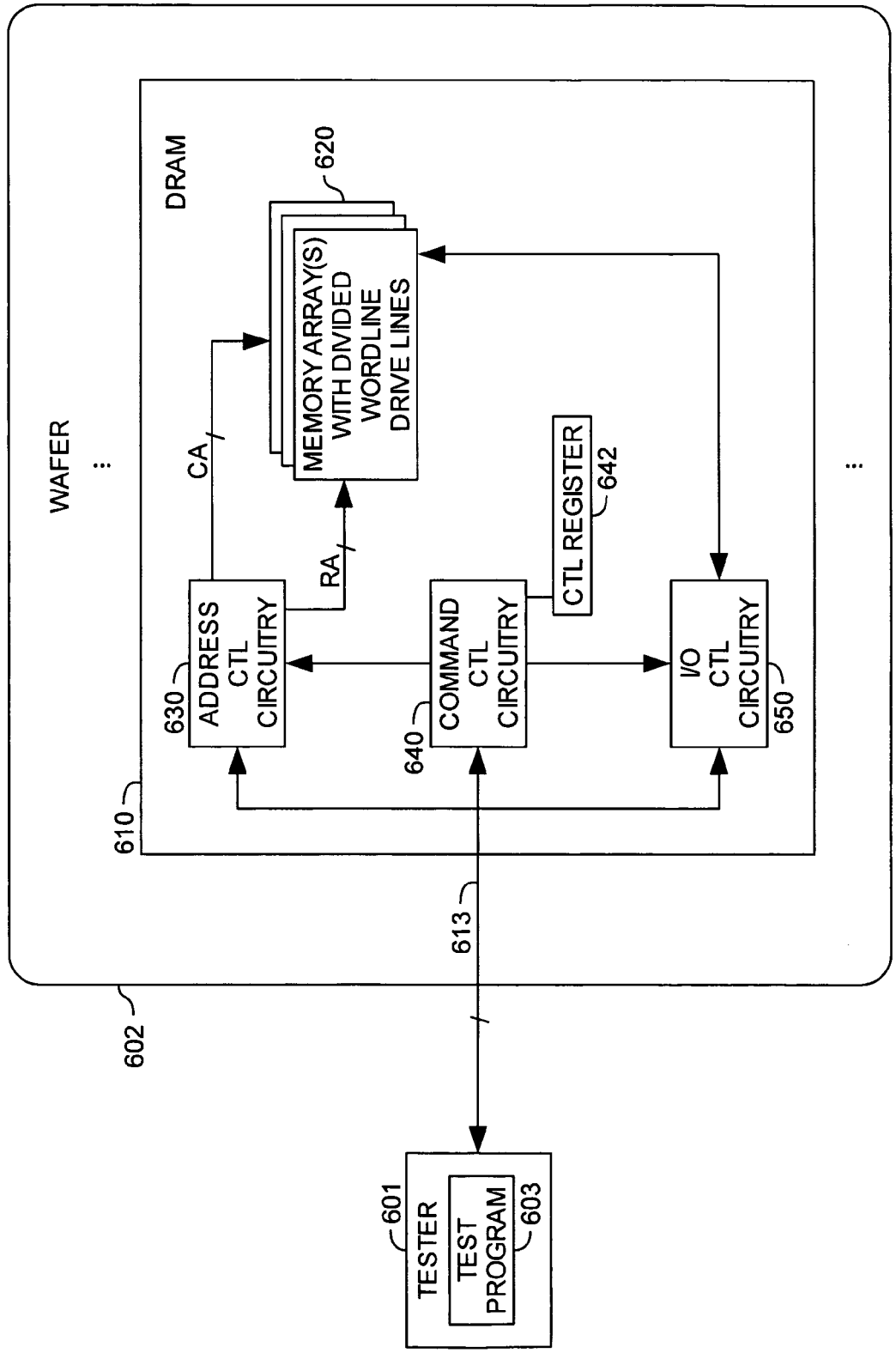
FIG. 6 illustrates an exemplary system for testing a memory device, in accordance with one embodiment of the present invention.

For example, FIG. 6 illustrates an exemplary test system 600 in which a tester 601 may be configured to execute a test program 603 that configures a memory device 610 for testing by accessing one or more control registers 642 thereon, according to one embodiment of the invention. The test program 603 may include a set of test data patterns and a sequence of operations to test for floating word lines in a DRAM device 610 under test. In other words, the tester program may be configured to interface with the device 610 via an interface 613 (e.g., address, data, and command lines) to perform the operations described above, with reference to FIG. 5.

For some embodiments, the interface 613 may include a line for supplying a forced external intermediate voltage level to be applied to word lines under test. For some embodiments, instead of or in addition to utilizing an externally forced voltage, the device 610 may include circuitry to generate the intermediate voltage level internally.

In any case, data patterns designed to detect the presence of floating word lines may be written to particular cells via addressing circuitry 630 and I/O control circuitry 650. As illustrated, the device 610 may include one or more memory arrays 620 having divided word line drive lines, as described above and shown in FIGS. 3 and 4.

In operation (e.g., during wafer test), the tester 601 may issue commands to write to one or more control registers 642 to place the device 610 in a test mode, select a side of an array 620 to test, and the like. The operations described above for testing floating word lines may be performed as part of a separate test or as part of a more comprehensive test.

CONCLUSION

By driving word lines on different sides of an array independently, word lines on one side of the array may be forced to an intermediate voltage level associated with floating word lines. These floating word lines may cause detectable read failures when accessing memory cells on the other side of the array. As a result, memory devices containing such defects may be identified on the front end before they reach the field.

While the foregoing is directed to embodiments of the present invention, other and further embodiments of the invention may be devised without departing from the basic scope thereof, and the scope thereof is determined by the claims that follow.

What is claimed is:

1. A method for detecting floating word lines in a dynamic random access memory device having at least one memory array, wherein voltage levels are applied to word lines of different side segments of the array by different drive and reset lines, comprising:
   forcing one or more first word lines in a first side segment of the memory array to an intermediate voltage level between a word line high voltage level and a negative word line low voltage level;
   applying the negative word line voltage level to one or more reset lines of the first side segment coupled to the first word lines via one or more pull-down transistors to bring the one or more first word lines in the first side segment to the negative word line voltage level; and
   accessing one or more memory cells on a second side segment of the memory array to detect a read failure indicative of one of the first word lines not being properly connected to the reset line via one of the pull-down transistors during application of the negative word line voltage level to the one or more reset lines.

2. The method of claim 1, wherein forcing one or more first word lines in a first side segment of the memory array to the intermediate voltage level comprises supplying an external voltage signal.

3. The method of claim 1, wherein forcing one or more first word lines in a first side segment of the memory array to the intermediate voltage level comprises generating a voltage signal internally to the device.

4. The method of claim 1, wherein accessing one or more memory cells on a second side segment of the memory array comprises accessing one or more memory cells coupled to a bit line also coupled to one of the first word lines.

5. The method of claim 4, wherein the intermediate voltage level is in the range of approximately 1.3 V to 1.6V.

6. A method of testing a memory device with a memory array having at least first and second side segments, wherein word lines in the first side segment are driven by different drive and reset lines than the word lines in the second side segment, comprising:
   driving word lines in both the first and second side segments in a substantially similar manner, via the different drive and reset lines, when the memory device is in a first mode; and
   driving word lines in the first and second side segments independently of each other, via the different drive and reset lines, when the memory device is in a second mode.

7. The method of claim 6, wherein driving word lines in the first and second side segments in an independent manner comprises:
   forcing one or more word lines in the first side segment to an intermediate voltage level between a word line high voltage level and a negative word line low voltage level.

8. The method of claim 7, wherein driving word lines in the first and second side segments in an independent manner further comprises:
   accessing one or more memory cells on the second side segment of the memory array to detect a read failure indicative of one of the first word lines not being properly connected to a reset line on the first side segment via a pull-down transistor.

9. A memory array, comprising:
   first and second sets of one or more master word lines on corresponding first and second side segments of the array;
   for each master word line, a plurality of local word lines, each coupled with at least one memory cell;
   one or more common bit lines coupled to memory cells on both the first and second side segments; and
   divided drive and reset lines allowing local word lines on the first side segment to be driven to different voltage level than corresponding local word lines on the second side segment.

10. The memory array of claim 9, wherein each drive line is coupled to a local word line via a pull-up transistor controlled by the corresponding master word line.

11. The memory array of claim 9, wherein each reset line is coupled to a local word line via a pull-down transistor controlled by the corresponding master word line.

12. A memory device, comprising:
   a memory array having first and second side segments, each segment comprising a plurality of word lines, one or more common bit lines coupled to memory cells accessible via word lines in both the first and second side segments, and at least first and second drive and reset lines allowing word lines in the first and second side segments, respectively, to be driven to different voltage levels; and
   control circuitry configured to:
      drive, via one or more drive lines of the first drive lines of the first side segment, a first one or more word lines in the first side segment to an intermediate voltage level between a word line high voltage level and a negative word line low voltage level;
      apply the negative word line voltage level to one or more reset lines of the first reset lines of the first side segment, coupled to the first word lines via one or more pull-down transistors; and access one or more memory cells on a second side segment of the memory array to detect a read failure indicative of one of the first word lines not being properly connected to the reset line via one of the pull-down transistors.

13. The memory device of claim 12, further comprising circuitry to generate a voltage signal at the intermediate voltage level internally.

14. The memory device of claim 13, wherein the intermediate voltage level is externally adjustable.

15. The memory device of claim 12, further comprising one or more control registers writable to place the device in the test mode.

16. The memory device of claim 15, wherein the one or more control registers allow selection of one side or the other to be forced to the intermediate voltage level during the test mode.

17. A test system, comprising:
   a memory device having at least one memory array with first and second side segments, each segment comprising a plurality of word lines, one or more common bit lines coupled to memory cells accessible via word lines in both the first and second side segments, and at least first and second pairs of drive and reset lines allowing word lines in the first and second side segments to be driven to different voltage levels independently; and
   a tester programmed to test the device by placing the memory device in a test mode wherein the memory device is configured to force one or more first word lines in the first side segment of the memory array to an intermediate voltage level between a word line high voltage level and a negative word line low voltage level, apply the negative word line voltage level to one or more reset lines of the first side segment coupled to the first word lines via one or more pull-down transistors, and access one or more memory cells on a second side segment of the memory array.

18. The method of claim 17, wherein the tester is configured to compare a value of data retrieved from the one or more memory cells accessed on the second side segment of the array to data previously written to the array to detect floating word lines in the first side segment of the array.

19. The test system of claim 17, wherein the tester is configured to vary the intermediate voltage level and repeat the test.

20. The test system of claim 19, wherein the tester is configured to vary the intermediate voltage level by adjusting a voltage generator internal to the device under test.

21. The test system of claim 17, wherein the tester supplies the device with a voltage signal at the intermediate voltage level.

22. A memory device, comprising:
   a first memory means for storing data;
   a second memory means for storing data, wherein memory cells in the first and second memory means are coupled to shared sets of sense amplifiers via bit lines;
   activation means for activating the first memory means;
   first drive means coupled to the first memory means for driving the word line means to an intermediate voltage level between a word line high voltage level and a negative word line low voltage level;
   first reset means for applying the negative word line voltage level to the activation means via one or more pull-down transistors; and
   detection means for accessing the second memory means and detecting floating activation means characterized by a defective connection between pull-down transistors and the activation means.

* * * * *